United States Patent
Mueller et al.

(10) Patent No.: US 7,828,893 B2
(45) Date of Patent: Nov. 9, 2010

(54) SILICON WAFER AND PROCESS FOR THE HEAT TREATMENT OF A SILICON WAFER

(75) Inventors: Timo Mueller, Burghausen (DE);
Wilfried von Ammon, Hochburg/Ach (AT); Erich Daub, Emmerting (DE);
Peter Krottenthaler, Simbach (DE);
Klaus Messmann, Burghausen (DE);
Friedrich Passek, Adlkofen (DE);
Reinhold Wahlich, Tittmoning (DE);
Arnold Kuehhorn, Berlin (DE);
Johannes Studener, Cottbus (DE)

(73) Assignee: Siltronic AG, Munich (DE)

( * ) Notice: Subject to any disclaimer, the term of this patent is extended or adjusted under 35 U.S.C. 154(b) by 1250 days.

(21) Appl. No.: 11/386,855

(22) Filed: Mar. 22, 2006

(65) Prior Publication Data

US 2006/0213424 A1 Sep. 28, 2006

(30) Foreign Application Priority Data

Mar. 24, 2005 (DE) .................. 10 2005 013 831

(51) Int. Cl.
*C30B 15/10* (2006.01)
(52) U.S. Cl. .............. 117/3; 117/4; 117/8; 117/13; 117/213; 117/217
(58) Field of Classification Search .......... 117/3, 117/4, 8, 13, 213, 217
See application file for complete search history.

(56) References Cited

U.S. PATENT DOCUMENTS

| | | | |
|---|---|---|---|
| 5,935,320 A | 8/1999 | Graef et al. | |
| 6,065,615 A | 5/2000 | Uchiyama et al. | |
| 6,133,121 A | 10/2000 | Tsunashima et al. | |
| 6,197,606 B1 * | 3/2001 | Polignano et al. | 438/17 |
| 6,350,314 B1 | 2/2002 | von Ammon et al. | |

(Continued)

FOREIGN PATENT DOCUMENTS

EP    0 829 559 A1    3/1998

(Continued)

OTHER PUBLICATIONS

T. Müller et al., Modeling and Experimental Verification of the 300 mm Ar Anneal Process, Semiconductor Silicon 2002, 9th International Symposium.

(Continued)

*Primary Examiner*—Robert M Kunemund
(74) *Attorney, Agent, or Firm*—Brooks Kushman P.C.

(57) ABSTRACT

A silicon wafer having no epitaxially deposited layer or layer produced by joining to the silicon wafer, with a nitrogen concentration of $1 \cdot 10^{13}$-$8 \cdot 10^{14}$ atoms/cm$^3$, an oxygen concentration of $5.2 \cdot 10^{17}$-$7.5 \cdot 10^{17}$ atoms/cm$^3$, a central thickness BMD density of $3 \cdot 10^8$-$2 \cdot 10^{10}$ cm$^{-3}$, a cumulative length of linear slippages $\leq 3$ cm and a cumulative area of areal slippage regions $\leq 7$ cm$^2$, the front surface having <45 nitrogen-induced defects of >0.13 μm LSE in the DNN channel, a layer at least 5 μm thick, in which $\leq 1 \cdot 10^4$ COPs/cm$^3$ with a size of $\geq 0.09$ μm occur, and a BMD-free layer $\geq 5$ μm thick. Such wafers may be produced by heat treating the silicon wafer, resting on a substrate holder, a specific substrate holder used depending on the wafer doping. For each holder, maximum heating rates are selected to avoid formation of slippages.

15 Claims, 5 Drawing Sheets

U.S. PATENT DOCUMENTS

| | | | |
|---|---|---|---|
| 7,037,797 B1 * | 5/2006 | Shooshtarian et al. | 438/308 |
| 2004/0040632 A1 | 3/2004 | Oosterlaken | |
| 2006/0278157 A1 * | 12/2006 | Seuring et al. | 117/2 |

FOREIGN PATENT DOCUMENTS

| | | |
|---|---|---|
| EP | 1 081 254 A1 | 3/2001 |
| EP | 1 087 042 A1 | 3/2001 |
| EP | 1 615 261 A1 | 1/2006 |
| GB | 2 273 551 A | 6/1994 |
| JP | 2003109964 A | 4/2003 |
| WO | WO 2004/090967 A1 | 10/2004 |

OTHER PUBLICATIONS

H. R. Huff, L. Fabry and S. Kishino (Eds.), Argon-Annealed 300 mm Wafers Complementing PP-Epitaxial Layers, The Electrochemical Society Proceedings vol. 2002-2, 194-201.

H. D. Chiou et al., Effects of Oxygen and Nitrogen on Slip in C2 Silicon Wafers, VLSI Science and Technology, ECS, Pennington, 59, 1984.

A. Karoui, F. Sahtout, F. Karoui, G. A. Rozgonyi, D. Yang, Journal of Applied Physics, 96, 2004, p. 3255.

A. Karoui, G. A. Rozgonyi, Journal of Applied Physics, 96, 2004, p. 3264.

* cited by examiner

SILICON WAFER AND PROCESS FOR THE HEAT TREATMENT OF A SILICON WAFER

BACKGROUND OF THE INVENTION

1. Field of the Invention

The invention relates to a nitrogen-doped silicon wafer and to a process for producing the silicon wafer by means of a heat treatment.

2. Background Art

Silicon single crystals, which are generally produced using the Czochralski crucible pulling (CZ) process or the crucible-free float zone process (FZ) have a number of impurities and defects. The single crystals are cut into wafers, subjected to a multiplicity of machining steps in order to obtain the desired surface quality, and finally are generally used for the fabrication of electronic components. If special precautions are not taken, the abovementioned defects are also present at the surface of the wafers, where they can have an adverse effect on the function of the electronic components produced thereon.

One significant type of defect is what are known as COPs (crystal originated particles), accumulations of vacancies forming small voids with a size of typically from 50 to 150 nm. According to the Voronkov theory, they occur whenever the ratio of the pulling rate and thermal gradient, measured over the interface between silicon melt and silicon ingot, exceeds a critical value. This is described as a pulled "vacancy-rich" ingot. The size of the COPs is significantly smaller at the edge of a silicon wafer than in the center, since the ingot shell cools more quickly than the ingot center, and therefore the time during which COPs can grow through vacancy agglomeration is shorter.

These defects can be measured with the aid of numerous methods. Partial etching of the defects by means of an SC1 solution ($NH_3/H_2O_2/H_2O$) at approximately 85° C. for 20 minutes followed by scattered light measurement is one way of checking for COPs on the wafer surface. Partial etching of the defects by means of a Secco etch for 30 minutes with silicon removal of approximately 30 μm and subsequent counting also allows these defects to be determined. If the defects which have what is known as a flag are counted, this is known as FPD (flow pattern defects). The result obtained is an FPD density per unit area which, taking into account the amount of material removed during the preparatory etch, can be converted into a density per unit volume. The same defects can also be measured by means of IR-LST ("infrared light scattering tomography"), in which an Nd-YAG laser beam is scattered at the defects in the silicon wafer, and the scattered light is detected at an angle of 90° to the laser beam. According to this measurement method, the defects are referred to as LSTD defects. A commercially available measuring unit which operates on the basis of this principle is marketed, for example, by Mitsui, Japan (appliance designation MO6) and is able to detect COPs down to a depth of 6 μm and to a minimum diameter of 35 nm.

In the text which follows, all these defects, which have for historic reasons been described differently but are caused by the same physical principle of agglomeration of vacancies, are referred to as COPs.

The prior art has disclosed processes for the heat treatment of silicon wafers which considerably reduce the COP density in a layer near to the surface and lead to what is known as a "COP-free zone" at the surface.

It is also known from the prior art to dope a silicon single crystal with nitrogen while it is being produced by means of the Czochralski crucible pulling process. According to EP 829 559 A1, the doping with nitrogen shifts the defect size distribution toward smaller defects. It is known from EP 1 087 042 A1 that doping with nitrogen leads to the formation of elongate or plateletlike COPs rather than octahedral COPs during the crystal pulling.

It is also known from the abovementioned documents for the nitrogen-doped silicon wafer to be subjected to a heat treatment at a temperature of over 1000° C. under a nonoxidizing atmosphere, for example hydrogen or argon or a mixture thereof, in order to remove COPs from a layer at the surface of the wafer. The layer at the surface, in which the COP density is reduced to less than half the value prior to the heat treatment, is at least 0.5 μm thick according to EP 1 087 042 A1.

It is also known that nitrogen doping promotes the formation of oxygen precipitates ("bulk micro defects"=BMDs), since the nitrogen boosts the nucleation for this type of defect. A sufficiently high BMD density of typically $5 \cdot 10^8$ to $2 \cdot 10^{10}$ $cm^{-3}$, preferably over the entire wafer thickness, but at least in the vicinity of the zone which is active for semiconductor devices, is necessary in order to allow what is known as the gettering of metal atoms in the interior of the silicon wafer. Only in this way is it possible to keep the layer close to the surface, in which components are subsequently to be fabricated, free of undesirable metal impurities.

Another advantage of the nitrogen doping is the greater hardness of the silicon wafer which can be achieved as a result, so that the formation of slippages can be effectively avoided during the heat treatment. This desirable effect, which is exploited in the prior art (T. Müller et al. in: Semiconductor Silicon 2002 (9th International Symposium), H. R. Huff, L. Fabry and S. Kishino (Eds.), The Electrochemical Society Proceedings Vol. 2002-2, 194-201) occurs in particular above a nitrogen concentration of $8 \cdot 10^{14}$ atoms/$cm^3$. The nitrogen doping leads to an increase in the upper yield stress ($\tau_{UY}$). This material parameter indicates the Minimum shear stress which needs to be applied in order for a solid to be deformed not just elastically reversibly but plastically irreversibly. If the upper yield stress is increased by doping with nitrogen, plastic deformation of the silicon wafer, i.e. the formation of slippages, only occurs with the application of higher shear stresses. It was possible to demonstrate this effect both for FZ silicon pulled without a crucible and for CZ silicon (H. D. Chiou et al., VLSI Sci. And Tech., ECS, Pennington, 59, 1984).

The heat treatment of silicon wafers to dissolve COPs close to the surface generally takes place at temperatures between 1100° C. and 1300° C. for a period of from 30 minutes to three hours. A vertical furnace, in which a multiplicity of silicon wafers are treated simultaneously, arranged parallel above one another at a defined pitch, is generally used for this purpose. The silicon wafers are mounted in a holding device, known as the "boat", with each silicon wafer resting individually on a support, the substrate holder. Boats of this type are described for example in GB 2273551, U.S. Pat. No. 6,065,615 or U.S. Pat. No. 6,133,121. Substrate holders are described, for example, in US 2004/0040632A1 or WO 2004/090967A1. During the heat treatment, the boat is located in a generally cylindrical process chamber, which is heated from the lateral surface.

As a result of the heating from the lateral surface of the process chamber, a temperature difference between the edge and center of each silicon wafer is formed during the heating and cooling. The associated different thermal expansion during heating or contraction during cooling gives rise to thermal stresses. Moreover, the weight of the silicon wafer itself, in conjunction with the substrate holder, leads to gravity-induced stresses. If the sum of the two stress components exceeds the upper yield stress of the silicon wafer, undesirable slippages occur, reducing the yield in the fabrication of electronic components, since, for example, metal impurities preferentially accumulate at these crystal defects.

The larger the diameter of the silicon wafers, the greater the weight per unit area, and therefore the gravity-induced stresses, become. This drawback is not compensated for by a corresponding increase in the wafer thickness. The greater distance between the heated lateral surface of the process chamber and the center of the wafer with a larger wafer diameter also leads to higher thermal stresses. For this reason, the risk of the formation of slippages in silicon wafers with a diameter of 300 mm or more increases considerably compared to the silicon wafers which have hitherto been customary, with a diameter of at most 200 mm. Therefore, simple adaptation of the concepts for suppressing the formation of slippages with smaller wafer diameters is likewise not possible.

Therefore, doping with nitrogen is a standard process in the production of silicon wafers with a diameter of 200 mm or more in order to avoid slippage in the wafers at high process temperatures. This effect is of considerable technical importance in particular for the heat treatment of silicon wafers with a diameter of 300 mm which is used to dissolve COPs close to the surface, since a significantly higher yield can be achieved in this way.

As has been indicated above, doping with nitrogen is advantageous for a number of reasons. However, it has emerged that the heat treatment of a silicon wafer doped with nitrogen leads to additional defects on its surface. Since future component generations will require patterning in the nanometer range, these defects lead to device errors, such as for example lithography defects or a deterioration in what is known as the GOI (gate oxide integrity) value of the transistor gate oxide. Therefore, the occurrence of these defects needs to be avoided as far as possible.

On the other hand, for the reasons mentioned above, it is in many cases not possible to do without doping with nitrogen. Therefore, all the heat-treated silicon wafers with a diameter of 300 mm which are known in the prior art lead to a relatively low yield of functioning electronic components if they are produced using the most advanced component technologies. This problem is solved by the invention.

SUMMARY OF THE INVENTION

The invention relates to a silicon wafer which does not have any epitaxially deposited layer or any layer produced by joining to the silicon wafer, with a nitrogen concentration of from $1 \cdot 10^{13}$ atoms/cm$^3$ to $8 \cdot 10^{14}$ atoms/cm$^3$, an oxygen concentration of from $5.2 \cdot 10^{17}$ atoms/cm$^3$ to $7.5 \cdot 10^{17}$ atoms/cm$^3$, a BMD density in the center of the thickness of the silicon wafer of from $3 \cdot 10^8$ cm$^{-3}$ to $2 \cdot 10^{10}$ cm$^{-3}$, a cumulative total length of all the linear slippages of no more than 3 cm and a cumulative total area of all the areal slippage regions of no more than 7 cm$^2$, the front surface of the silicon wafer having fewer than 45 nitrogen-induced defects of a size of more than 0.13 µm LSE in the DNN channel, a layer with a thickness of at least 5 µm, in which no more than $1 \cdot 10^4$ COPs/cm$^3$ with a size of at least 0.09 µm occur, and a BMD-free layer with a thickness of at least 5 µm.

DETAILED DESCRIPTION OF THE PREFERRED EMBODIMENT(S)

The silicon wafer according to the invention has an oxygen concentration of from $5.2 \cdot 10^{17}$ atoms/cm$^3$ to $7.5 \cdot 10^{17}$ atoms/cm$^3$. In the present context, the term oxygen concentration is to be understood as meaning the total oxygen concentration, encompassing both interstitial oxygen and precipitated oxygen. This total oxygen concentration corresponds to the interstitial oxygen concentration present prior to the heat treatment.

It is preferable for the nitrogen concentration to be at most $6 \cdot 10^{14}$ atoms/cm$^3$, more preferably at most $4 \cdot 10^{14}$ atoms/cm$^3$, in order to reliably prevent the formation of nitrogen-induced defects during the heat treatment. The nitrogen concentration in the heat-treated silicon wafer is detected, for example, by means of an SIMS depth profile (SIMS=secondary ion mass spectroscopy). For this purpose, the nitrogen concentration is typically recorded as a function of depth, for example down to a depth of up to 30 µm from the surface, and integrated into two depth regions. As a result, on the one hand the background signal, which is dominated for example by the residual gas in the vacuum chamber, is determined, and on the other hand the nitrogen content bonded in the oxygen precipitates (BMDs) themselves is measured. The first depth region is preferably located within the BMD-free layer (typically at a depth of 5-10 µm) and after integration is given as a mean value in the unit atoms/cm$^3$. In the second depth region, in which oxygen precipitates occur (typically 25-30 µm), the SIMS signal is likewise integrated and given as a mean value in the unit atoms/cm$^3$. The background value is subtracted from this measured value, giving the mean nitrogen content bonded in the oxygen precipitates in the heat-treated wafer. A comparison with tests carried out on the wafer which has not yet been heat-treated typically reveals a nitrogen concentration which is 30-40% lower after the heat treatment according to the invention, which can be explained by the rapid diffusion of the nitrogen content which is not bonded in oxygen precipitates in the region close to the surface, by virtue of the occurrence of segregation (A. Karoui, F. Sahtout, F. Karoui, G. A. Rozgonyi, D. Yang, J. Appl. Phys, 96, 2004, p. 3255, A. Karoui, G. A. Rozgonyi, J. Appl. Phys, 96, 2004, p. 3264). To rule out the interference of influences from the wafer surface, a material-removing etching step which removes a few micrometers is carried out beforehand.

The silicon wafer preferably has a diameter of 300 mm or greater, in particular up to 450 mm.

Figure 8:
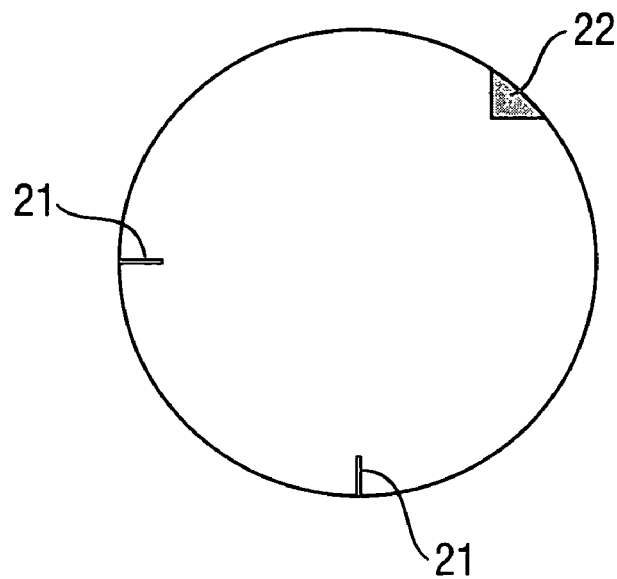
FIG. 8 diagrammatically depicts a distribution of linear slippages and areal slippage regions on a silicon wafer.

The silicon wafer according to the invention is distinguished by the fact that the total length of all the slippages which are not areal but may occur in linear form in the silicon wafer does not exceed 3 cm, preferably 1 cm. Linear slippages of this type are denoted by reference numeral 21 in the diagrammatic illustration presented in FIG. 8. Moreover, the total surface area of all the areal slippage regions which may occur in the silicon wafer does not exceed a size of 7 cm$^2$, preferably of 2 cm$^2$. FIG. 8 diagrammatically depicts an areal slippage region 22 of this type. The cumulative total length or total area of the slippages is the sum of the lengths or areas of all the individual slippages. Slippages or their length or area can be detected using X-ray topography measurement (XRT) or an elastic stress measurement (SIRD, scanning infrared depolarization, JenaWave, Jena, Germany).

The BMD density in the center of the thickness of the silicon wafer can be measured, for example, using an infrared oxide precipitate counter of type MO4 produced by Mitsui, Japan. The number of nitrogen-induced defects of a size of more than 0.13 μm LSE (latex sphere equivalent) in the DNN channel is determined by light scattering measurement. A description is given further below of how these defects can be distinguished from other types of defects.

At its front surface, the silicon wafer according to the invention preferably has a BMD-free layer with a thickness of 5 μm, more preferably 8 μm, but most preferably, 15 μm. The front surface is the surface of the silicon wafer which is intended for the fabrication of electronic components. The thickness of the BMD-free zone is determined, for example, by producing a broken edge, treating this edge with a suitable etching solution (for example a dilute Wright etching solution for a period of approx. 20 minutes) and then observing it under an optical microscope.

According to the invention, in addition to the BMD-free layer, the front surface of the silicon wafer additionally has a layer with a thickness of at least 5 μm, preferably 10 μm, in which no more than 1·10$^4$ COPs/cm$^3$ with a size of at least 0.09 μm occur.

On account of the very low defect densities, the silicon wafer according to the invention is eminently suitable for the fabrication of electronic components and leads to considerably improved yields.

The tests which led to the present invention involved the discovery and characterization of the defect type referred to as "nitrogen-induced defects", which was not hitherto known. This defect type occurs on the surface of silicon wafers which have been doped with nitrogen and subjected to a heat treatment. These are defects arranged in the shape of a ring or areally on the surface of the silicon wafer; the characterization of these defects is described in detail below.

Nitrogen-induced defects can be detected, for example, in the "dark field narrow normal incident" channel of the surface inspection system SP1 produced by KLA-Tencor, USA, and on account of their characteristic properties under angle-resolved scattered light examinations can be unambiguously distinguished from other defects. These defects likewise appear in the topography image of a scanning probe microscope as very shallow recesses with a depth of up to 5 nm covering up to 3 μm.

During the angle-resolved scattered light measurement, a well-focused laser beam is used to scan the surface of the silicon wafer. If the laser beam encounters a defect, the defect also scatters light into solid angles into which no light is reflected with an ideal surface. Accordingly, the scattered light is detected in the otherwise "dark" solid angle range, which is why this method is described as dark field measurement.

The angle-resolved intensity distribution of the scattered light is characteristic of different types of defects. The same also applies to the newly discovered nitrogen-induced defect. This defect differs significantly from defect types such as COPs, particles and structural epitaxial defects. In the event of perpendicular laser incidence, the nitrogen-induced defect scatters into solid angles close to the normal to the specimen, whereas scarcely any light is observed at larger angles.

The surface inspection system KLA-Tencor SP1 has two dark field detectors, one of them near to the normal to the specimen, known as the dark field narrow (DN). The second, dark field wide (DW), detects light which is scattered into larger angles. Therefore, these channels are able to detect the characteristic light scattering of the defects. The result in the case of the nitrogen-induced defect is that the defect is detected in the DN channel with perpendicular (normal=N) light incidence, i.e. in the DNN channel, but is not observed in the DWN channel.

With this type of measurement, the observed light intensity is converted into a size equivalent, the LSE (latex sphere equivalent). For the nitrogen-induced defect, a scatter size of up to 0.2 μm LSE results in the DNN, whereas no signal is recorded in the DWN even at a sensitivity of 0.1 μm LSE. The ratio of the scatter sizes of DNN and DWN for this defect is therefore greater than 2.0. This ratio can be regarded as a feature of the particular type of defect. The ratios of the light scatter sizes for other known defects differ considerably from the nitrogen-induced defect (cf. Tables 1 and 2).

TABLE 1

| Light scatter size (μm LSE)/ defect type | DNN | DWN | DNO | DWO |
| --- | --- | --- | --- | --- |
| Particle | All sizes | All sizes | All sizes | All sizes |
| COP | <0.25 | <0.18 | <0.25 | <0.18 |
| Structural epitaxial defect | >0.1 | All sizes | All sizes | All sizes |
| Polishing defect | All sizes | All sizes | All sizes | All sizes |
| Nitrogen-induced defect | <0.2 | <0.1 | <0.1 | <0.07 |

TABLE 2

| Light scatter size ratio/defect type | DNN/DWN | DNN/DNO | DNN/DWO |
| --- | --- | --- | --- |
| Particle | 0.8 to 1.2 | 0.8 to 1.2 | 0.8 to 1.2 |
| COP | 1.0 to 1.4 | 0.9 to 1.2 | 1.3 to 2.0 |
| Structural epitaxial defect | >1.4 | 1.1 to 3.0 | 1.2 to 3.0 |
| Polishing defect | 0.8 to 1.8 | 0.7 to 1.8 | 1.2 to 2.0 |
| Nitrogen-induced defect | >2.0 | >2.0 | >2.7 |

The measuring appliance KLA-Tencor SP1 allows a variation in the angle of incidence of the laser light. In addition to the perpendicular incidence of light, the specimen can also be measured using obliquely (oblique=O) incident light. The channels DN and DW are then referred to as DNO and DWO.

In this mode too, the unique scattering characteristic of the nitrogen-induced defect is clear, since the defect cannot be detected at sensitivities of 0.1 μm LSE and 0.075 μm LSE either in the DNO or in the DWO.

Accordingly, the light scattering size ratios are DNN/DNO >2.0 and DNN/DWO >2.7. This is once again a clear characteristic of this defect. The light scattering sizes and the ratios of the light scattering sizes of the nitrogen-induced defects are criteria which unambiguously identify this type of defect. The abovementioned characteristic combination of the light scattering sizes and light scattering size ratios only has an overlap with the structural epitaxial defects, but these cannot occur in the heat-treated silicon wafer according to the invention, which does not have an epitaxial layer.

According to the invention, therefore, nitrogen-induced defects are defined as surface defects on a silicon wafer which does not have an epitaxial layer; these defects can be detected by light scattering measurement, for example using the surface inspection system KLA-Tencor SP1 and have the light scattering sizes given in Table 1 and at the same time the light scattering size ratios given in Table 2.

Figure 1:
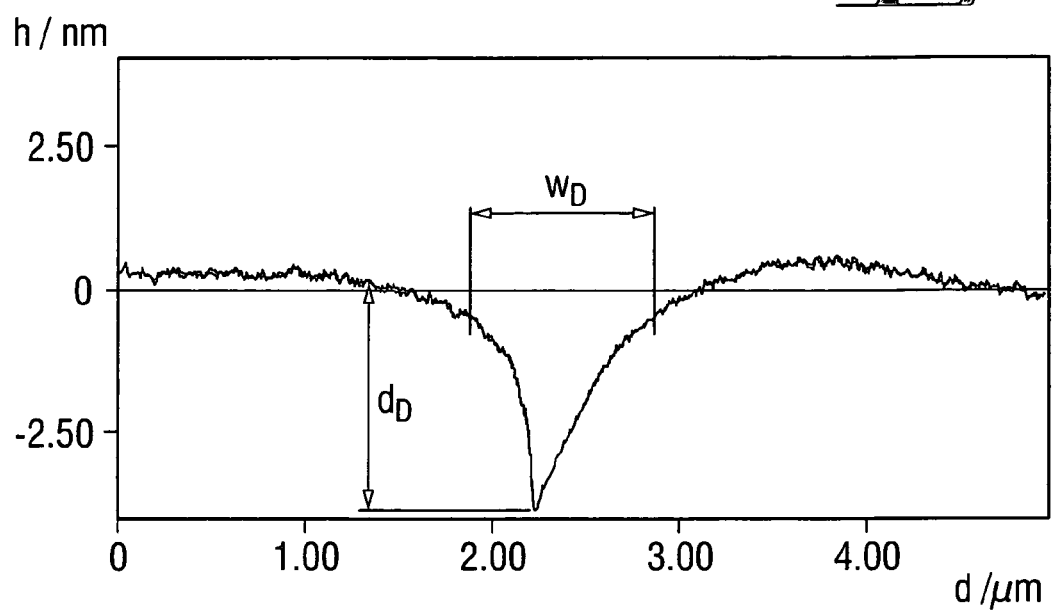
FIG. 1 shows a depth profile, determined by means of AFM (atomic force microscopy), of a typical nitrogen-induced defect on a silicon wafer according to the prior art.

The nitrogen-induced defects can also be detected using other methods, for example AFM (atomic force microscopy). For example, with AFM measurement elongate depressions in the surface are found precisely at the defect positions determined by the scattered light measurement. FIG. 1 shows, as a result of an AFM measurement of this type, the depth profile of a typical nitrogen-induced defect along a straight line which runs along the short axis (="width") of the defect through the location of its greatest depth. The width WD of the defect is 0.99 μm, its depth $d_D$ is 4 nm. If the characteristic variables depth, length and width are evaluated, it is possible to determine aspect ratios (length/depth or width/depth) which are likewise characteristic of nitrogen-induced defects, cf. Table 3.

TABLE 3

| Aspect ratio | Minimum | Maximum |
| --- | --- | --- |
| Length/depth | 500 | 1200 |
| Width/depth | 100 | 300 |

The tests which led to the present invention have shown that there is a close relationship between the nitrogen doping and the occurrence of nitrogen-induced defects following a heat treatment, which is the reason why this name was selected for the newly discovered type of defect. This relationship is illustrated in Table 4. Practically no nitrogen-induced defects occur below a threshold value for the nitrogen concentration [N] of approx. $8 \cdot 10^{14}$ atoms/cm³. Above this threshold value, there is a strong, monotone increase in the number of nitrogen-induced defects as the nitrogen concentration rises. The defect density was measured after the silicon wafers had been heat-treated for one hour at 1200° C. in 100% argon. The values given in Table 4 relate to the total number of nitrogen-induced defects on the entire front surface of a silicon wafer with a diameter of 200 mm.

TABLE 4

| [N]/atoms/cm³ | Number of nitrogen-induced defects |
| --- | --- |
| $1.18 \times 10^{14}$ | 8 |
| $2.98 \times 10^{14}$ | 58 |
| $4.28 \times 10^{14}$ | 22 |
| $7.38 \times 10^{14}$ | 30 |
| $8.08 \times 10^{14}$ | 38 |
| $8.48 \times 10^{14}$ | 318 |
| $11.78 \times 10^{14}$ | 411 |

The following can be assumed to be a cause of the formation of nitrogen-induced defects, on account of the typical surface density: at a nitrogen concentration of more than approximately $8 \cdot 10^{14}$ atoms/cm³, COPs have a highly anisotropic morphology, i.e. they are not octahedral in form, as with low nitrogen concentrations, but rather take the form of small bars. The dissolution of the near-surface COPs during the heat treatment and the filling process at atomic level leaves behind a trough-shaped recess which—like the COP from which it was formed—is always oriented in the direction of the main crystallographic axes.

Another cause is the insufficient dissolution of what are known as oxygen-induced stacking faults (OSFs) during the heat treatment. OSFs are to be regarded as large oxide precipitates. These occur in the form of a defect region centered in a ring shape, the width and diameter of which ring is dependent to a crucial extent on the level of the nitrogen doping and the crystal pulling rate during the Czochralski method. It is not technologically possible to force this region to the outer edge of the wafer at higher nitrogen concentrations by increasing the pulling rate. Measurements carried out by means of SP1 again indicate an increased density of nitrogen-induced defects in this OSF ring region if the nitrogen concentration exceeds a value of $8 \cdot 10^{14}$ atoms/cm³. On account of the large lateral extent of the OSFs and the limited surface diffusion rate of the silicon atoms, a shallow hollow likewise remains in the region of the defect dissolved during the heat treatment.

To suppress the formation of nitrogen-induced defects, therefore, the nitrogen concentration has to be restricted to a value of at most $8 \cdot 10^{14}$ atoms/cm³, preferably $6 \cdot 10^{14}$ atoms/cm³, and more preferably, $4 \cdot 10^{14}$ atoms/cm³. Processes for producing a nitrogen-doped silicon single crystal, from which silicon wafers of this type can be produced, are described, for example, in EP 1 087 042 A1 (paragraph 36) or EP 1 081 254 A1. Although by restricting the nitrogen concentration it is possible to effectively avoid the formation of nitrogen-induced defects, the silicon wafer then becomes susceptible to slippages occurring during the heat treatment.

Figure 5:
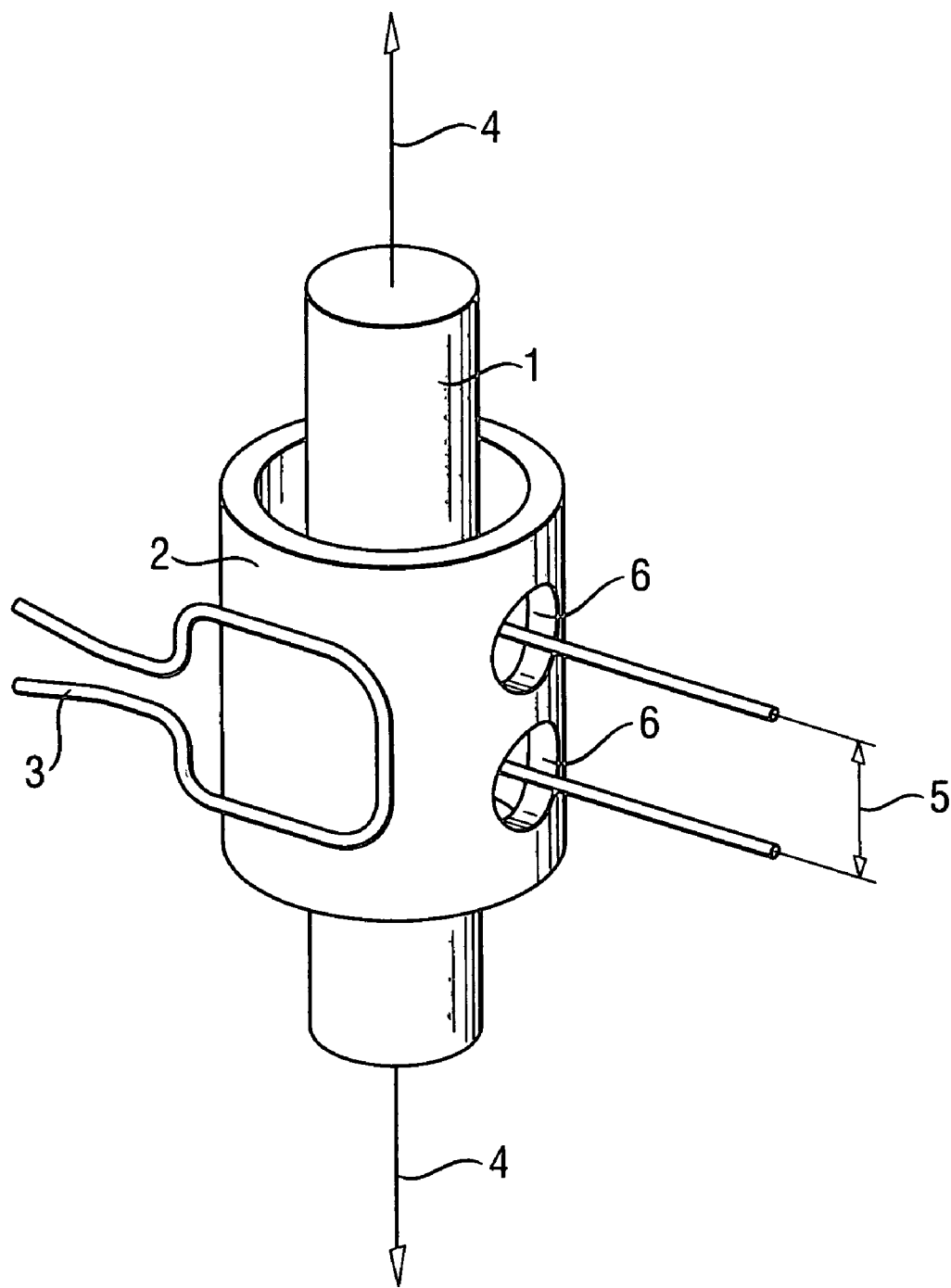
FIG. 5 diagrammatically depicts the principle of measuring the upper yield stress of silicon.

To quantify the susceptibility of differently doped silicon to slippages, the inventors have carried out measurements of the upper yield stress. Hitherto, no data for the upper yield stress of silicon has been available for the temperature range above 1000° C. The measurements are carried out using a setup as illustrated in FIG. 5. A cylindrical rod 1 made from the silicon material to be tested, with a thickness of 5 mm and a length of 20 cm, is heated to the measurement temperature by means of a cuvette 2 consisting of silicon carbide. The heating of the cuvette 2 by means of an induction coil 3 allows homogeneous heating of the silicon rod 1. By applying an elongating force 4 to both ends of the silicon rod 1, an elongation is produced preferably in the region of the rod which is at the highest temperature. The stressing can be carried out, for example, in a universal spindle testing machine with a 5 kN load cell. At the same time, the change in length 5 and the temperature are measured at the location of the highest temperature. By way of example, a water-cooled elongation recording system can be used to measure the elongation. The special sensor arms preferably consist of aluminum oxide, on account of the high temperature. The measurement length of the sensor system is, for example, 25 mm with a compressive force in the range of 1 N to 5 N. The temperature measurement is carried out, for example, using a quotient pyrometer (not shown) through slots 6 in the cuvette 2 on the hot surface of the specimen.

The results of a temperature-dependent measurement series carried out on silicon with a nitrogen concentration of $1.3 \cdot 10^{14}$ atoms/cm$^3$ are reproduced in Table 5. The upper yield stress $\tau_{UY}$ of silicon drops drastically at the temperatures T of over 1100° C. which are customary for the heat treatment used to anneal COPs.

TABLE 5

| T/° C. | $\tau_{UY}$/MPa |
|---|---|
| 1000 | 20.5 |
| 1200 | 2.0 |
| 1320 | 1.2 |
| 1350 | 0.8 |

The concentration of dopants also has an influence on the upper yield stress $\tau_{UY}$ of the silicon wafer, as can be seen from Table 6. The values were determined at a temperature of 1200° C. The values for the electrical resistivity R given in the table were set by doping with boron. The nitrogen concentration [N] and the boron concentration (the latter expressed by the resistivity R) have a considerable influence on the upper yield stress. By contrast, a change in the concentration of interstitial oxygen [O$_i$] in the range which is customary for CZ silicon has scarcely any effect on the upper yield stress.

TABLE 6

| Wafer No. | [N]/ atoms/cm$^3$ | [O$_i$]/ atoms/cm$^3$ | R/Ωcm | $\tau_{UY}$/MPa |
|---|---|---|---|---|
| N1 | $3.3 \times 10^{13}$ | $6.83 \times 10^{17}$ | 72.3 | 0.32 |
| N2 | $1.31 \times 10^{14}$ | $6.88 \times 10^{13}$ | 63.8 | 0.6 |
| N3 | $1.32 \times 10^{14}$ | $6.34 \times 10^{17}$ | 0.97 | 0.8 |
| N4 | $1.21 \times 10^{15}$ | $6.9 \times 10^{17}$ | 1.7 | 0.92 |
| W1 | $9.8 \times 10^{13}$ | $5.19 \times 10^{17}$ | 1.61 | 0.88 |
| W2 | $9.8 \times 10^{13}$ | $5.85 \times 10^{17}$ | 8.48 | 0.56 |
| O1 | $9.8 \times 10^{13}$ | $5.19 \times 10^{17}$ | 1.61 | 0.88 |
| O2 | $9.8 \times 10^{13}$ | $6.3 \times 10^{17}$ | 1.0-1.6 | 0.8 |

On account of the fact that the upper yield stress is highly dependent on the nitrogen concentration, it was not possible for silicon wafers with a diameter of 300 mm and a low nitrogen content according to the prior art to be subjected to a heat treatment at high temperatures without having to accept significant damage to the crystal lattice caused by the formation of slippages. This reduces the yield of heat-treated silicon wafers that are suitable for the fabrication of electronic components to virtually zero.

Silicon wafers according to the invention, in particular with a diameter of 300 mm or more, are produced by subjecting silicon wafers with defined properties to a heat treatment in a vertical furnace (for example series A412 produced by ASM, the Netherlands). During the heat treatment, the silicon wafers are mounted on substrate holders which preferably consist of silicon carbide and minimize the flexural stresses in the silicon wafer. Furthermore, these substrate holders should preferably have a thermal mass which is as low as possible, in order to allow high heating and cooling rates during the heat treatment. Furthermore, the substrate material used should preferably have the minimum possible contamination with metals. This can be achieved, for example, by the use of what is known as "solid CVD" silicon carbide, which is available for example from Mitsui, Japan. It is also possible to use sintered silicon carbide coated with a 20 to 200 µm thick layer of solid CVD silicon carbide. Material of this type is available, for example, from Toshiba Ceramics, Japan.

The invention uses planar substrate holders which have an external diameter that is at least equal to the diameter of the silicon wafers to be treated. According to the invention, the silicon wafer therefore rests on the substrate holder all the way to the edge of the wafer. The diameter of the substrate holders is preferably 0 to 2 mm larger than the diameter of the silicon wafers to be treated.

To avoid the formation of slippages caused by the silicon wafer resting on inner edges or local elevations of the substrate holders, according to the invention the substrate holder has to have a flatness with deviations, based on a leveled plane, of from 0.05 mm to 0.5 mm over the entire surface of the substrate holder, with deviations of less than 0.3 mm being preferred and less than 0.15 mm being particularly preferred. According to the invention, the thickness of the substrate holder is adapted to the required flatness as a function of the type and material.

On account of the reactivity of the unoxidized silicon surface at high temperatures, the risk of irreversible adhesion caused by the formation of chemical bonds between the silicon atoms of the silicon wafer and the substrate holder should be avoided. To do this, it is expedient to set a predetermined roughness value $R_a$. Experiments have shown that roughnesses $R_a$ of from 0.15 µm to 0.5 µm are preferred, and from 0.25 µm to 0.4 µm are particularly preferred.

Therefore, the invention also relates to substrate holders made from silicon carbide which have the abovementioned properties required to avoid slippages.

According to the invention, different substrate holders which are matched to the properties of the silicon wafers and differ in terms of their thermal mass and in terms of the gravity-induced stresses caused in the silicon wafer, are used for the heat treatment. The gravity-induced stresses can be estimated by finite element calculations. The results for three types of substrate holders according to the invention used for the heat treatment of silicon wafers with a diameter of 300 mm are reproduced in Table 7.

TABLE 7

Figure 2:
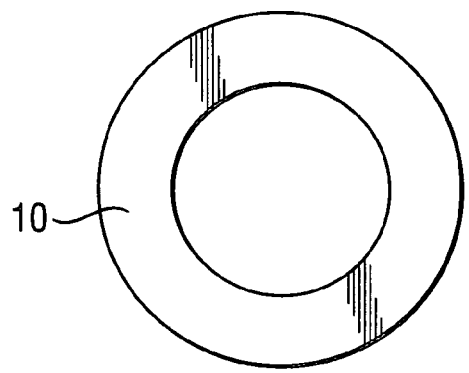
FIG. 2 shows a substrate holder according to the invention in the form of a continuous ring.
Figure 3:
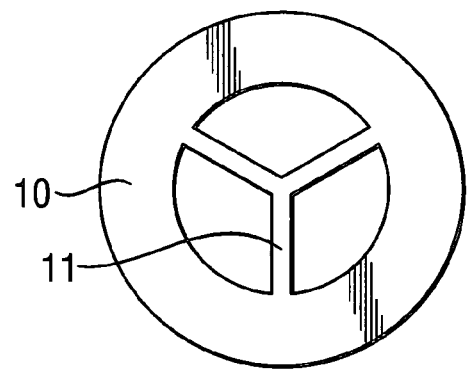
FIG. 3 shows a substrate holder according to the invention in the form of a continuous ring with an additional bearing surface in the center of the ring.
Figure 4:
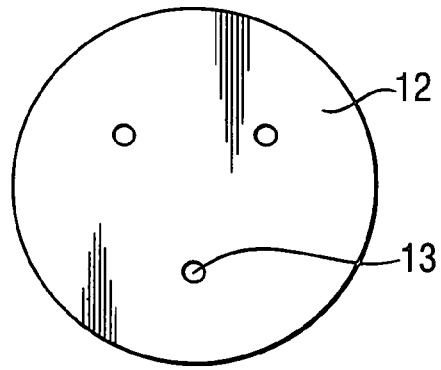
FIG. 4 shows a substrate holder according to the invention in the form of a plate.

| Substrate holder type | Maximum flexural stress [N/mm$^2$] | Mean contact pressure [N/mm$^2$] |
|---|---|---|
| Continuous ring (FIG. 2), external diameter = 300 mm, internal diameter = 200 mm | 0.465 | <0.03 |
| Continuous ring with additional bearing surface in the center (FIG. 3), external diameter = 300 mm, internal diameter = 200 mm | 0.347 | <0.03 |
| Plate (FIG. 4), external diameter = 300 mm, internal diameter = 0 | 0.297 | <0.03 |

As can be seen from Table 7, the tests which led to the present invention have shown that the maximum flexural stress decreases from the continuous-annular substrate holder, through the continuous-annular substrate holder with additional bearing surface in the center of the ring, to the plate-like substrate holder. A plate-like substrate holder has the optimum properties in this respect, but also has the drawback of a higher thermal mass.

According to the invention, the substrate holder is adapted to the susceptibility of the silicon wafers that are to be treated to slippages. The invention uses substrate holders which do not cause any slippages in the silicon wafers to be treated at the selected heating and cooling rates. Since a higher thermal mass of the substrate holders is associated with lower heating and cooling rates and therefore with longer process times, which in turn entail costs for the heat treatment, it is preferable always to use the type of substrate holder with the lowest thermal mass which still allows slippage-free processing. By using adapted substrate holders which reduce the gravity-induced stresses to different extents, it is possible for all types of differently doped silicon wafers to be subjected to a heat treatment which does not cause slippages, albeit at the cost of process times which are lengthened to different extents, yet at the same time to ensure a process duration which is as short as possible.

It is preferable for silicon wafers with a nitrogen concentration of $1 \cdot 10^{13}$ atoms/cm$^3$ to $8 \cdot 10^{14}$ atoms/cm$^3$, preferably from $1 \cdot 10^{13}$ atoms/cm$^3$ to $6 \cdot 10^{14}$ atoms/cm$^3$, and an interstitial oxygen concentration of from $5.2 \cdot 10^{17}$ atoms/cm$^3$ to $7.5 \cdot 10^{17}$ Atoms/cm$^3$ to be used as starting material for the production of silicon wafers according to the invention. The nitrogen concentration in combination with the duration of the heat treatment is selected in such a way that the desired thickness of the COP-free zone can be achieved. According to the invention, these silicon wafers are subjected to a heat treatment in a vertical furnace, with a multiplicity of silicon wafers arranged parallel above one another being simultaneously held for 30 minutes to 3 hours at a temperature in the range from 1100° C. to 1300° C., preferably in the range from 1150° C. to 1230° C. The vertical pitch of the substrate holders is preferably 7.5 to 15 mm, more preferably 10 to 13 mm, calculated from bearing surface to bearing surface, for the preferred embodiments of the process according to the invention.

In the embodiments of the process presented herein, the heat treatment is preferably carried out as follows: the silicon wafers are loaded into the process chamber in a two-stage operation at a typical loading temperature of 400 to 600° C. For this purpose, the substrate holder is moved onto the wafer to be loaded from below by means of a back-surface end effector. The wafer is mounted on three concentrically arranged holding pins, which are lowered during the loading operation. Then, the silicon wafer and substrate holder are jointly loaded into the boat.

After that, the process chamber is heated at a predetermined heating rate until a predetermined target temperature (according to the invention between 1100° C. and 1300° C.) is reached. The heating rate is preferably at most 20° C./minute at temperatures of up to 800° C. and at most 10° C./minute, preferably 8° C./minute, in the temperature range from 800° C. to 900° C. In the temperature range above 900° C., the maximum heating rates are defined by the inequalities which are given below and are adapted to the properties of the silicon wafers. The process chamber is then held at this temperature for a predetermined period of time, generally from 30 minutes to 3 hours, in order to allow the annealing of the COPs. Thereafter, the process temperature is reduced at a predetermined cooling rate to the unloading temperature of typically 400 to 600° C. The permitted and preferred values for the cooling rates are the same as for the heating rates.

According to the invention, the heat treatment is carried out under conditions which allow the formation of a BMD-free layer at the surface of the silicon wafer. This requires an inert or reducing atmosphere. An inert atmosphere contains exclusively gases which do not react with the surface of the silicon wafers, for example noble gases such as argon. A reducing atmosphere preferably contains hydrogen, which may be mixed with inert gases. The duration and temperature of the heat treatment ensure that a BMD-free layer of the desired thickness is produced.

According to the invention, the silicon wafers are divided into three classes depending on the upper yield stress of the silicon wafers (and therefore on the concentration of nitrogen, interstitial oxygen and other dopants). Each class is assigned a suitably adapted substrate holder type which produces sufficiently low gravity-induced stresses for the silicon wafers in question. Moreover, each class is assigned a condition, adapted to the properties of silicon wafer and substrate holder, for the heating and cooling rates during the heat treatment. The use of the substrate holders according to the invention, in combination with the adherence to the heating and cooling rates according to the invention, allows the heat treatment of silicon wafers with a large diameter and a relatively low nitrogen concentration without risking the formation of slippages.

According to the invention, one specific type of silicon wafer may be allocated to a plurality of classes. In this case, to avoid slippages it is irrelevant which class the silicon wafers are assigned to. For economic considerations, however, it is preferable to assign the silicon wafers to the possible class with the highest number, since it is then possible to use substrate holders with the lowest possible thermal mass, which in turn allow the highest possible heating and cooling rates.

The text which follows describes the conditions for the heat treatment of silicon wafers for each of the three classes in detail.

Class 3 comprises silicon wafers with an upper yield stress of at least 0.6 MPa, preferably in the range from 0.6 MPa to 1.1 MPa, more preferably from 0.7 MPa to 1.0 MPa, measured at a temperature of 1200° C. This includes, for example, silicon wafers which have a nitrogen concentration of $3 \cdot 10^{13}$ atoms/cm$^3$ to $8 \cdot 10^{14}$ atoms/cm$^3$, an interstitial oxygen concentration of from $5.2 \cdot 10^{17}$ atoms/cm$^3$ to $7.5 \cdot 10^{17}$ atoms/cm$^3$ and a resistivity of from 2 mΩcm to 12 Ωcm.

During the heat treatment, silicon wafers of this type are supported by substrate holders (cf. FIG. 2) which are in the shape of a continuous concentric ring 10. The external diameter of the ring is at least equal to the diameter of the silicon wafer. The internal diameter is at most 250 mm, with a range from 150 mm to 250 mm being preferred, and from 170 to 220 mm being particularly preferred. Experiments and ancillary finite element calculations using different ring widths have shown that a further reduction in the internal diameter to less than 150 mm (as disclosed for example in WO 2004/090967A1) does not bring about any significant reduction in the contact pressure which occurs at the inner edge. For this reason, such small internal diameters are unnecessary and are preferably to be avoided on account of the high thermal mass of the substrate holder.

The substrate holders have a flatness with deviations in the range from 0.05 mm to 0.5 mm, preferably from 0.07 mm to 0.25 mm, from an ideal leveled plane.

The thickness of the substrate holders according to this embodiment is preferably in the range from 1 mm to 3 mm, particularly preferably from 1.5 to 2.5 mm, if the substrate holders consist of silicon carbide.

All the temperature changes which take place during the heat treatment of silicon wafers of class 3 as part of the heating and cooling in a temperature range above 900° C. are carried out at a rate RR which is selected in such a way that the following relationship exists between the current temperature T (in °C.) and the current rate RR (in °C./minute):

$$|RR| \leq 5.8 \times 10^{-4} + 0.229 \times T - 3.5902137 \times 10^{-4} \times T^2 + 1.4195996 \times 10^{-7} \times T^3$$

This relationship is to be observed both during the heating operation and during the cooling operation. For this reason, it is the absolute value of the rate, |RR|, which stands on the left-hand of the inequality.

Class 2 comprises silicon wafers with an upper yield stress of at least 0.4 MPa, preferably in the range from 0.4 MPa to 0.8 MPa, and more preferably from 0.5 MPa to 0.7 MPa, measured at 1200°C. This includes, for example, silicon wafers which have a nitrogen concentration of from $3 \cdot 10^{13}$ atoms/cm$^3$ to $8 \cdot 10^{14}$ atoms/cm$^3$, an interstitial oxygen concentration of from $5.2 \cdot 10^{17}$ atoms/cm$^3$ to $7.5 \cdot 10^{17}$ atoms/cm$^3$ and a resistance of from 8 Ωcm to 60 Ωcm.

During the heat treatment, silicon wafers of this type are supported by substrate holders (see FIG. 3) which are in the form of a continuous concentric ring 10 with an additional bearing surface in the center of the ring. This additional bearing surface is preferably formed by at least three bearing strips 11 which run out radially from the center of the ring and are connected to the ring and preferably in each case include an angle of 120°. The other properties of the substrate holder correspond to the properties of the substrate holders used for silicon wafers of class 3. The use of an additional bearing surface in the center of the ring further reduces stresses caused by the weight of the silicon wafer itself. However, the higher thermal mass of the substrate holder requires a reduction in the heating and cooling rates:

All the temperature changes which take place during the heat treatment of silicon wafers belonging to class 2 during the heating and cooling in a temperature range over 900°C. are therefore carried out at a rate RR which is selected in such a way that the following relationship exists between the current temperature T (in °C.) and the current rate RR (in °C./minute):

$$|RR| \leq 7.469 \times 10^2 - 1.6928 \times T + 1.28112 \times 10^{-3} \times T^2 - 3.2306467 \times 10^{-7} \times T^3$$

Class 1 comprises silicon wafers with an upper yield stress of at least 0.3 MPa, preferably in the range from 0.3 to 0.6 MPa, and more preferably from 0.3 to 0.5 MPa, measured at 1200°C. These include, for example, silicon wafers which have a nitrogen concentration of $1 \cdot 10^{13}$ atoms/cm$^3$ to $1 \cdot 10^{14}$ atoms/cm$^3$, an interstitial oxygen concentration of from $5.2 \cdot 10^{17}$ atoms/cm$^3$ to $7.0 \cdot 10^{17}$ atoms/cm$^3$ and a resistivity of from 40 Ωcm to 90 Ωcm.

During the heat treatment, silicon wafers of this type are supported by substrate holders (cf. FIG. 4) which are in the form of a plate 12 which supports the silicon wafer resting on it over substantially its entire surface. The plate preferably has a diameter which is 0 to 2 mm larger than that of the silicon wafer. A projection of this order is suitable for compensating for floating of the silicon wafer which occurs when loading the substrate holder on account of the brief occurrence of an air cushion. This means that even after the possible occurrence of slight floating, the silicon wafer still rests on the substrate holder over its entire surface. There is no need to use any greater projection, since this would unnecessarily increase the thermal mass. It is preferable for the plate to have at least three, and most preferably precisely three, openings 13 with a diameter in the range from 3 to 6 mm, through which loading aids (pins) can be passed, so as to allow two-stage loading as described above.

The thickness of the plate-like substrate holder is preferably in the range from 0.4 to 0.8 μm, more preferably in the range from 0.55 to 0.7 μm, if the substrate holders consist of silicon carbide. The plate-like substrate holder is more mechanically stable and resistant to deformation than the angular substrate holder with or without an additional bearing surface in the center. Consequently, a lower thickness is sufficient for the plate-like substrate holder. This avoids an unnecessarily high thermal mass. The remaining properties of the substrate holder correspond to the properties of the substrate holders used for silicon wafers belonging to class 3. If plate-like substrate holders are used, the stresses caused by the weight of the silicon wafer itself are reduced still further. However, the even higher thermal mass requires a further reduction in the heating and cooling rates:

All the temperature changes which take place during the heat treatment of silicon wafers belonging to class 1 during the heating and cooling in a temperature range over 900°C. are therefore carried out at a rate RR which is selected in such a way that the following relationship exists between the current temperature T (in °C.) and the current rate RR (in °C./minute):

$$|RR| \leq 9.258 \times 10^2 - 2.2317 \times T + 1.79552 \times 10^{-3} \times T^2 - 4.8169846 \times 10^{-7} \times T^3$$

It is preferable for the substrate holders of all the types described to consist of silicon carbide. They preferably have a constant thickness over their entire area, i.e. do not have an elevated edge region and do not have any grooves or similar structures, in order to minimize the costs of producing the substrate holder, since any variation in thickness requires a further mechanical step to produce it, which on the one hand entails costs and on the other hand involves the risk of forcing metallic impurities into the substrate holder.

The surface of the substrate holder on which the silicon wafer rests preferably has a mean roughness $R_a$ of from 0.15 μm to 0.5 μm, more preferably from 0.2 μm to 0.4 μm and most preferably from 0.25 μm to 0.35 μm. The mean roughness $R_a$ is measured over a distance of 5000 μm using a mechanical profiler, for example Dektak V 300 produced by Veeco, USA.

If silicon wafers with the properties indicated are heat-treated in the manner described, the result is a "COP-free" layer close to the surface, with a thickness of at least 5 μm, preferably 10 μm and up to 15 μm, a "BMD-free" layer with a thickness of at least 5 μm and up to 15 or even 25 μm, and a BMD density in the interior of the silicon wafer which is suitable for ensuring sufficient gettering properties. If the nitrogen concentration according to the invention is maintained, the formation of nitrogen-induced defects during the heat treatment is largely avoided. Therefore, the process according to the invention allows the production of silicon wafers with fewer than 45, and even fewer than 10 down to, for example, two or even zero nitrogen-induced defects (cf. FIG. 11). At the same time, the substrate holders and the conditions of the heat treatment, in particular the heating and cooling rates, are matched to the properties of the silicon wafers in such a way that the silicon wafers, despite their relatively low nitrogen content, do not slip during the heat treatment, since the thermally induced stresses and gravity-induced stresses are kept at a low level which does not cause any damage to the silicon wafer. It is therefore possible to produce silicon wafers which are completely devoid of areal and linear slippage regions (cf. FIG. 7). Therefore, the process described allows the production of the silicon wafer according to the invention.

Example 1

A single-crystal silicon ingot with a nitrogen concentration of $6 \cdot 10^{13}$ atoms/cm$^3$ at the start of the ingot and of $2.5 \cdot 10^{14}$ atoms/cm$^3$ at the end of the ingot, an interstitial oxygen concentration of from $6.5 \cdot 10^{17}$ atoms/cm$^3$ to $6.6 \cdot 10^{17}$ atoms/cm$^3$ and a resistivity of from 8 Ωcm to 12 Ωcm is pulled by the Czochralski process and cut into wafers. The wafers are polished. Based on the dopant concentrations, all the wafers can be classified as class 2 according to the invention. The silicon wafers are subjected to a heat treatment according to the invention in an atmosphere consisting of 100% argon with a holding time of 2 hours at 1200° C., during which heat treatment they rest on substrate holders with a roughness of $R_a = 0.15$ μm, which are suitable for class 2. The heating and cooling rates are selected in such a way that at any temperature they correspond to the inequality given for class 2.

Figure 9:
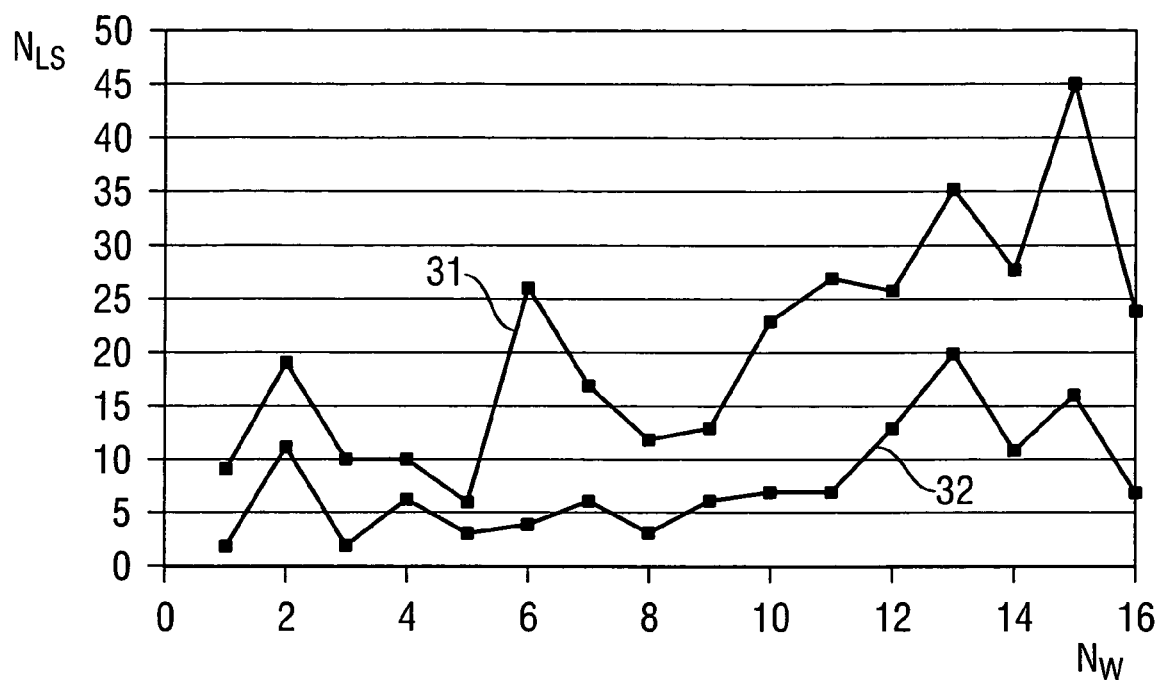
FIG. 9 shows the frequency of nitrogen-induced defects on silicon wafers with a nitrogen concentration of from $6 \cdot 10^{13}$ atoms/cm$^3$ to $2.5 \cdot 10^{14}$ atoms/cm$^3$ after a heat treatment according to the invention.

Then, a plurality of wafers which originated from different positions along the axis of the ingot are measured by means of SP1 for the occurrence of nitrogen-induced defects. FIG. 9 shows the comparison of the DNN channel (>0.128 μm LSE; curve 31) with the DWN channel (>0.120 μm LSE; curve 32). The figure gives the total number $N_{LS}$ of the localized light scatterers over the entire front surface of the silicon wafers detected in the respective channel. The low wafer numbers $N_W$ originate from the start of the ingot, while the high numbers originate from the end of the ingot. The significantly higher count rate in the DNN channel shows the occurrence of nitrogen-induced defects. However, the total number of defects detected is at most 45 for all the wafers.

Figure 7:
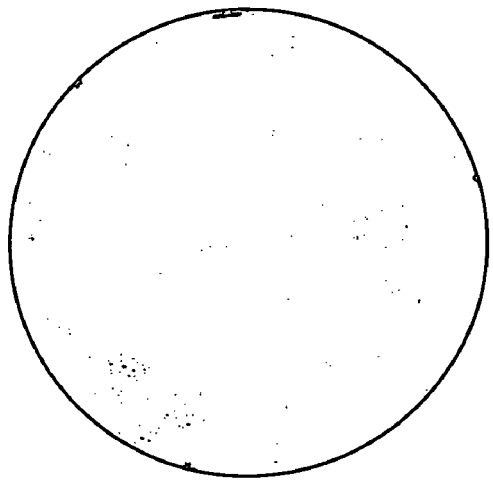
FIG. 7 shows a measurement result corresponding to that shown in FIG. 6, but for a silicon wafer according to the invention with a diameter of 300 mm.

Moreover, the processed silicon wafers are tested for slippages by means of SIRD. FIG. 7 shows a slippage-free silicon wafer produced in accordance with this example.

An MO6 measurement carried out on these silicon wafers reveals a COP density of 0.8 COPs/cm$^2$, based on a layer thickness of 5 μm. This gives a volume-based COP density of 1600 COPs/cm$^3$ in this layer. The BMD density in the bulk of the silicon wafers is $8 \cdot 10^9$ BMDs/cm$^3$ to $1.5 \cdot 10^{10}$ BMDs/cm$^3$, measured by MO4.

Figure 10:
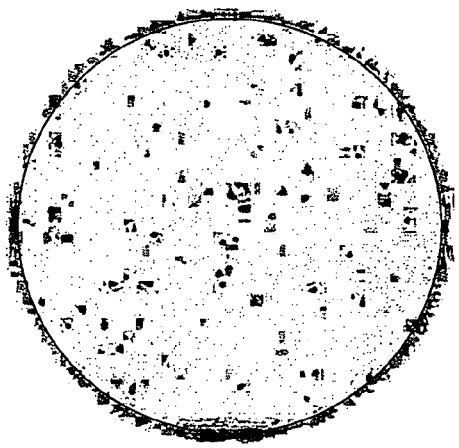
FIG. 10 shows the absence of an area-centered COP region by means of light scattering measurement (SP1) on a silicon wafer with a diameter of 300 mm which has been heat-treated in accordance with the invention and then subjected to polishing, removing 10 µm of material.

One of the silicon wafers which had been heat-treated in accordance with the invention was subjected to stock-removal polishing, removing 10 μm of material. This wafer had a nitrogen concentration of $1.9 \cdot 10^{14}$ atoms/cm$^3$, which it was possible to determine on the basis of the ingot position, use of the known segregation coefficient of nitrogen in silicon and measurement of the nitrogen concentration at the start of the ingot by means of mass spectrometry. To reveal the COPs, the wafer, after the polishing, was etched by means of SC1 solution (NH$_3$/H$_2$O$_2$/H$_2$O) at approximately 85° C. for 20 minutes. Then, an SP1 scattered light measurement was carried out, examining the entire surface of the wafer. FIG. 10 shows the results of this measurement with scattering events which occurred in the dark field normal channel with a scattering intensity of greater than 0.12 μm LSE. The wafer does not reveal any circle-centered COP defect pattern, as would be expected for a pulled vacancy-rich silicon ingot, if COPs which had not been dissolved by the heat treatment were present. The measurement therefore led to the result that the silicon wafer examined has a COP-free layer with a thickness of at least 10 μm.

Example 2

A single-crystal silicon ingot with a nitrogen concentration of $3 \cdot 10^{13}$ atoms/cm$^3$ at the start of the ingot and of $1.2 \cdot 10^{14}$ atoms/cm$^3$ at the end of the ingot, an interstitial oxygen concentration of on average $5.6 \cdot 10^{17}$ atoms/cm$^3$ and a resistivity of from 20 to 30 Ωcm is pulled using the Czochralski process and cut into wafers. The wafers are polished. The silicon wafers are subjected to a heat treatment according to the invention in an atmosphere consisting of 100% argon. The heat treatment comprises a heating operation, a treatment at a constant temperature of 1200° C. for two hours and a cooling operation, with ramp rates of from 1 to 10° C./minute being adhered to during the heating and cooling operations. During the heat treatment, the silicon wafers are mounted on substrate holders made from silicon carbide, which are in the shape of a continuous concentric ring with or without an additional bearing surface in the center of the ring.

Figure 11:
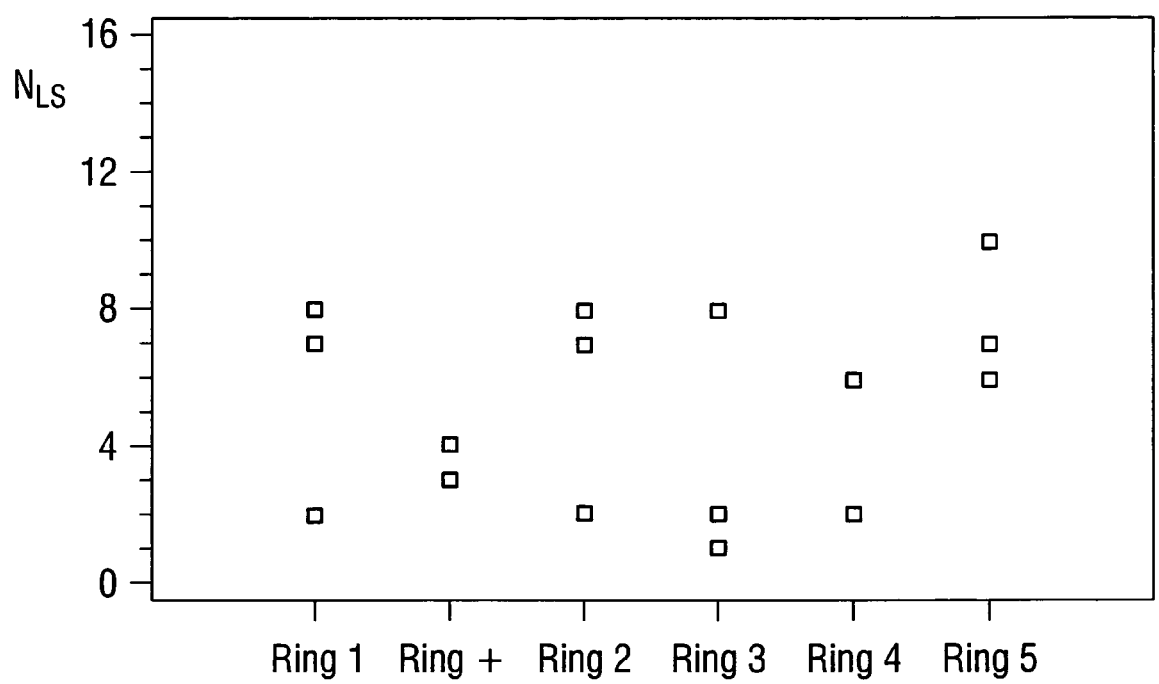
FIG. 11 shows the frequency of nitrogen-induced defects on silicon wafers with a nitrogen concentration of from $3 \cdot 10^{13}$ atoms/cm$^3$ to $1.2 \cdot 10^{14}$ atoms/cm$^3$ following a heat treatment according to the invention.

Then, a plurality of wafers which originated from different positions along the axis of the ingot were measured by means of SP1 for the occurrence of nitrogen-induced defects. FIG. 11 shows the total number $N_{LS}$ of the localized light scatterers (>0.128 μm LSE) detected in the DNN channel on the entire front surface of the silicon wafers. The measured values denoted by "ring1" to "ring4" relate to silicon wafers which during the heat treatment were mounted on substrate holders in the shape of a continuous concentric ring, while the measured values denoted by "ring+" relate to silicon wafers which were mounted on substrate holders in the form of a continuous concentric ring with an additional bearing surface in the center of the ring. All the wafers have a very low number of nitrogen-induced defects.

Comparative Example 1

Figure 6:
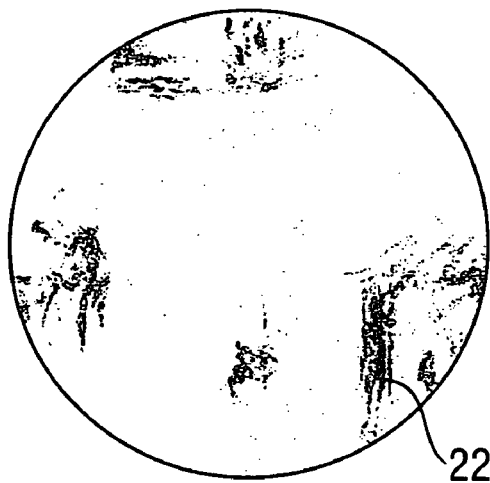
FIG. 6 shows the distribution of the slippages in a silicon wafer according to the prior art with a diameter of 300 mm, determined by means of high-resolution elastic stress measurement.

A further batch of silicon wafers, which were produced from the silicon ingot in accordance with Example 1, is heat-treated in a similar way to in Example 1. The substrate holders are identical to the substrate holders used in Example 1 but have a lower roughness of $R_a = 0.10$ μm. The processed silicon wafers are once again examined for slippages by means of SIRD. FIG. 6 shows that very large slippage regions 22 occur purely on account of the lower roughness.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for the heat treatment of a multiplicity of silicon wafers with a diameter of at least 300 mm
said process comprising resting wafers on supports selected with regard to the upper yield stress of the wafer, and at predetermined heating and cooling rate, as follows:
a) for wafers having an upper yield stress of at least 0.6 MPa, measured at a temperature of 1200° C., in a vertical furnace,
resting the silicon wafers during the heat treatment on substrate holders which are in the form of a continuous concentric ring with an internal diameter of at most 250 mm and an external diameter which is at least equal to the diameter of the silicon wafers, the surfaces of the substrate holders on which the silicon wafers rest having a flatness with deviations in the range from 0.05 mm to 0.5 mm from an ideal leveled plan, heating the silicon wafers, at the start of the heat treatment, to a target temperature in the range from 1100° C. to 1300° C. at a predetermined heating rate, holding the silicon wafers at the target temperature for a period of from 30 minutes to 3 hours under an inert or reducing atmosphere, and cooling the silicon wafers at a predetermined cooling rate, wherein the predetermined heating and cooling rates RR (in ° C./minute) in the temperature range above 900° C. are selected as a function of the current temperature T (in ° C.) such that the following condition is satisfied:

$$|RR| \leq 5.8 \times 10^{-4} + 0.229 \times T - 3.5902137 \times 10^{-4} \times T^2 + 1.4195996 \times 10^{-7} \times T^3;$$

b) for wafers having an upper yield stress of at least 0.4 Mpa, measured at a temperature of 1200° C., in a vertical furnace, resting the silicon wafers during the heat treatment on substrate holders which are in the form of a continuous concentric ring with an internal diameter of at most 250 mm and an external diameter which is at least equal to the diameter of the silicon wafers, and with an additional bearing surface in the center of the ring, the surfaces of the substrate holders on which the silicon wafers rest having a flatness with deviations in the range from 0.05 mm to 0.5 mm from an ideal leveled plan, the silicon wafers, at the start of the heat treatment, are heated up to a target temperature in the range from 1100° C. to 1300° C. at a predetermined heating rate, holding the silicon wafers at the target temperature for a period of 30 minutes to 3 hours under an inert or reducing atmosphere, cooling the silicon wafers are then cooled at a predetermined cooling rate, and the predetermined heating and cooling rates RR (in ° C./minute) in the temperature range above 900° C. are selected as a function of the current temperature T (in ° C.) in such a way that the following condition is satisfied:

$$|RR| \leq 7.649 \times 10^2 - 1.6928 \times T + 1.28112 \times 10^{-3} \times T^2 - 3.2306467 \times 10^{-7} \times T^3;$$

c) for wafers having an upper yield stress of at least 0.3 MPa, measured at a temperature of 1200° C., in a vertical furnace, resting the silicon wafers during the heat treatment on substrate holders which are in the form of a plate with an external diameter which is at least equal to the diameter of the silicon wafers, the surfaces of the substrate holders on which the silicon wafers rest having a flatness with deviations in the range from 0.05 mm to 0.5 mm from an ideal leveled plane, heating the silicon wafers, at the start of the heat treatment to a target temperature in the range from 1100° C. to 1300° C. at a predetermined heating rate, holding the silicon wafers at the target temperature for a period of 30 minutes to 3 hours under an inert or reducing atmosphere, cooling the silicon wafers at a predetermined cooling rate, wherein the heating and cooling rate RR (in ° C./minute) in the temperature range above 900° C. is selected as a function of the current temperature T (in ° C.) in such a way that the following condition is satisfied;

$$|RR| \leq 9.258 \times 10^2 - 2.2317 \times T + 1.79552 \times 10^{-3} \times T^2 - 4.8169846 \times 10^{-7} \times T^3.$$

2. The process of claim 1 embodiment a), in which the silicon wafers have an upper yield stress in the range from 0.6 MPa to 1.1 MPa, measured at a temperature of 1200° C.

3. The process of claim 2, in which the silicon wafers, prior to the start of the heat treatment, have a nitrogen concentration of from $3 \cdot 10^{13}$ atoms/cm$^3$ to $8 \cdot 10^{14}$ atoms/cm$^3$, an interstitial oxygen concentration of from $5.2 \cdot 10^{17}$ atoms/cm$^3$ to $7.5 \cdot 10^{17}$ atoms/cm$^3$ and a resistivity of from 2 mΩcm to 12 Ωcm.

4. The process of claim 1, embodiment b), in which the silicon wafers have an upper yield stress in the range from 0.4 MPa to 0.8 MPa, measured at a temperature of 1200° C.

5. The process of claim 4, in which the silicon wafers, prior to the start of the heat treatment, have a nitrogen concentration of from $3 \cdot 10^{13}$ atoms/cm$^3$ to $8 \cdot 10^{14}$ atoms/cm$^3$, an interstitial oxygen concentration of from $5.2 \cdot 10^{17}$ atoms/cm$^3$ to $7.5 \cdot 10^{17}$ atoms/cm$^3$ and a resistivity of from 8 Ωcm to 60 Ωcm.

6. The process of claim 1, embodiment c), in which the silicon wafers have an upper yield stress in the range from 0.3 MPa to 0.6 MPa, measured at a temperature of 1200° C.

7. The process of claim 6, in which the silicon wafers, prior to the start of the heat treatment, have a nitrogen concentration of from $1 \cdot 10^{13}$ atoms/cm$^3$ to $1 \cdot 10^{14}$ atoms/cm$^3$, an interstitial oxygen concentration of from $5.2 \cdot 10^{17}$ atoms/cm$^3$ to $7.5 \cdot 10^{17}$ atoms/cm$^3$ and a resistivity of from 40 Ωcm to 90 Ωcm.

8. The process of claim 1, wherein the silicon wafers, prior to the start of the heat treatment, have a nitrogen concentration of at most $6 \cdot 10^{14}$ atoms/cm$^3$.

9. The process of claim 1, wherein the substrate holders on which the silicon wafers rest are mounted parallel above one another, at a pitch of from 7.5 to 15 mm, calculated from bearing surface to bearing surface, during the heat treatment.

10. The process of claim 1, wherein the substrate holders have a mean roughness $R_a$ of from 0.15 μm to 0.5 μm.

11. The method of claim 1, wherein the substrate holders comprise silicon carbide.

12. A silicon wafer which does not have any epitaxially deposited layer or any layer produced by joining to the silicon wafer, said silicon wafer having a nitrogen concentration of from $1 \cdot 10^{13}$ atoms/cm$^3$ to $8 \cdot 10^{14}$ atoms/cm$^3$, an oxygen concentration of from $5.2 \cdot 10^{17}$ atoms/cm$^3$ to $7.5 \cdot 10^{17}$ atoms/cm$^3$, a BMD density in the center of the thickness of the silicon wafer of from $3 \cdot 10^8$ cm$^{-3}$ to $2 \cdot 10^{10}$ cm$^3$, a cumulative total length of all linear slippages of no more than 3 cm and a cumulative total area of areal slippage regions of no more than 7 cm$^2$, the front surface of the silicon wafer having fewer than 45 nitrogen-induced defects of a size of more than 0.13 μm LSE in a DNN channel, a layer with a thickness of at least 5 μm, in which no more than $1 \cdot 10^4$ COPs/cm$^3$ with a size of at least 0.09 μm occur, and a BMD-free layer with a thickness of at least 5 μm.

13. The silicon wafer of claim 12, which has a nitrogen concentration of from $1 \cdot 10^{13}$ atoms/cm$^3$ to $6 \cdot 10^{14}$ atoms/cm$^3$.

14. The silicon wafer of claim 12, which has a diameter of 300 mm or greater.

15. A silicon wafer which does not have any epitaxially deposited layer or any layer produced by joining to the silicon wafer, said silicon wafer having a nitrogen concentration of from $1 \cdot 10^{13}$ atoms/cm$^3$ to $8 \cdot 10^{14}$ atoms/cm$^3$, an oxygen concentration of from $5.2 \cdot 10^{17}$ atoms/cm$^3$ to $7.5 \cdot 10^{17}$ atoms/cm$^3$, a BMD density in the center of the thickness of the silicon wafer of from $3 \cdot 10^8$ cm$^{-3}$ to $2 \cdot 10^{10}$ cm$^3$, a cumulative total length of all linear slippages of no more than 3 cm and a cumulative total area of areal slippage regions of no more than 7 cm$^2$, the front surface of the silicon wafer having fewer than 45 nitrogen-induced defects of a size of more than 0.13 μm LSE in a DNN channel, a layer with a thickness of at least 5 μm, in which no more than $1 \cdot 10^4$ COPs/cm$^3$ with a size of at least 0.09 μm occur, and a BMD-free layer with a thickness of at least 5 μm;

wherein said silicon wafer has been heat treated in accordance with claim 1.

* * * * *

UNITED STATES PATENT AND TRADEMARK OFFICE
CERTIFICATE OF CORRECTION

PATENT NO.        : 7,828,893 B2                                           Page 1 of 1
APPLICATION NO.   : 11/386855
DATED             : November 9, 2010
INVENTOR(S)       : Mueller It is certified that error appears in the above-identified patent and that said Letters Patent is hereby corrected as shown below:

Column 17, Line 39, Claim 1:

After "cooling the silicon wafers"
Delete "are then cooled"

Signed and Sealed this
Fifteenth Day of February, 2011

David J. Kappos
*Director of the United States Patent and Trademark Office*